United States Patent
Kraemer et al.

(10) Patent No.: US 11,025,251 B2
(45) Date of Patent: Jun. 1, 2021

(54) BUTTON ASSEMBLIES

(71) Applicant: Sateco AG, Nänikon (CH)

(72) Inventors: Ronny Kraemer, Dällikon (CH); Daniel Haefliger, Au ZH (CH)

(73) Assignee: Sateco AG, Nänikon (CH)

( * ) Notice: Subject to any disclaimer, the term of this patent is extended or adjusted under 35 U.S.C. 154(b) by 303 days.

(21) Appl. No.: 16/337,151

(22) PCT Filed: Oct. 13, 2017

(86) PCT No.: PCT/IB2017/056365
§ 371 (c)(1),
(2) Date: Mar. 27, 2019

(87) PCT Pub. No.: WO2018/104807
PCT Pub. Date: Jun. 14, 2018

(65) Prior Publication Data
US 2019/0229728 A1    Jul. 25, 2019

(30) Foreign Application Priority Data
Dec. 5, 2016 (CH) .................................. 01588/16

(51) Int. Cl.
*H03K 17/96* (2006.01)
*H01L 41/08* (2006.01)

(52) U.S. Cl.
CPC .......... *H03K 17/964* (2013.01); *H01L 41/08* (2013.01); *H03K 2217/96015* (2013.01)

(58) Field of Classification Search
CPC ........ H03K 17/964; H03K 2217/96015; H01L 41/08

USPC ......................................................... 310/339
See application file for complete search history.

(56) References Cited

FOREIGN PATENT DOCUMENTS

| EP | 0201421 A1 * | 11/1986 | .......... H04R 17/025 |
| JP | S5643551 U | 4/1981 | |
| JP | H-0935570 A | 2/1997 | |

OTHER PUBLICATIONS

International Search Report and Written Opinion for PCT/IB2017/05635 dated Feb. 12, 2018, 22 pages.

* cited by examiner

*Primary Examiner* — Tomi Skibinski
(74) *Attorney, Agent, or Firm* — Blank Rome LLP

(57) ABSTRACT

According to the present invention there is provided a button assembly, comprising, an actuator member; a base member having a cavity defined therein which can receive a least a part of the actuator member; a flexible film which comprises piezoelectric material, wherein the piezoelectric material is preferably dipolar particles; a first electrode which is located between the piezoelectric material of the flexible film and the actuator member, and a second electrode which is located between the piezoelectric material of the flexible film and the base member, and wherein the flexible film is arranged to overlay the cavity in the base member, and to be interposed between the base member and the actuator member, such that moving at least a part of the actuator member into the cavity of the base member will cause the film to stretch thereby generating an electrical signal in the first and second electrodes.

8 Claims, 11 Drawing Sheets

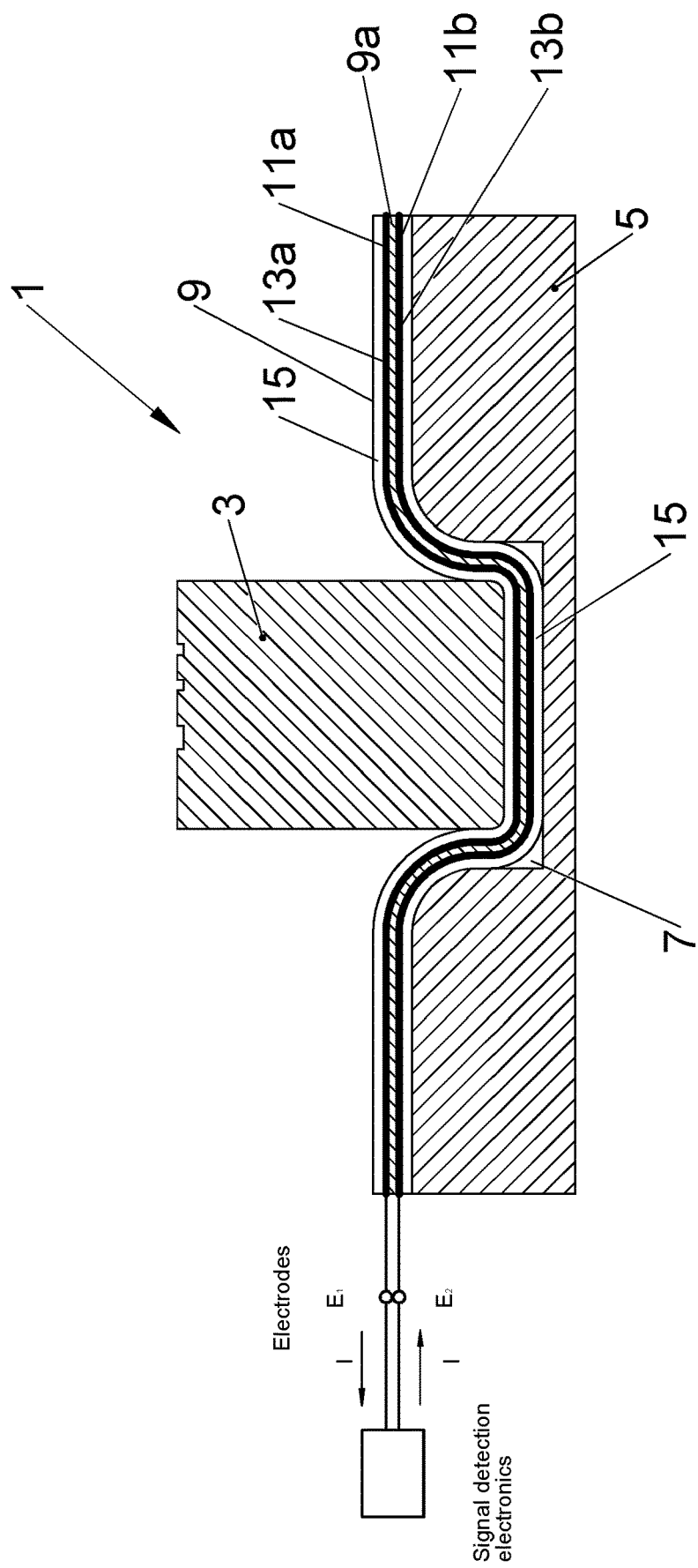

BUTTON ASSEMBLIES

RELATED APPLICATIONS

This application is a national phase of PCT/IB2017/056365, filed on Oct. 13, 2017, which claims the benefit of Swiss Application No. 01588/16, filed on Dec. 5, 2016. The entire contents of these applications are hereby incorporated by reference.

FIELD OF THE INVENTION

The present invention concerns button assemblies each of which uses piezoelectric material; in particular the present invention concerns button assemblies which comprises an elastic film comprising piezoelectric material, wherein the film is arranged to overlay a profiled surface, so that when a user presses the button assembly the film is stretched.

DESCRIPTION OF RELATED ART

A piezoelectric material is a material which has the ability to generate an electric charge in response to applied mechanical stress. Existing button assemblies which use piezoelectric material are typically designed to have a stiff top and bottom member, and a layer of piezoelectric material interposed between the stiff top and bottom members. During use the user will press on the top member so that the piezoelectric material is compressed between the stiff top and bottom members. The compression of the piezoelectric material causes the piezoelectric material to generate an electrical signal. The electrical signal which is generated is proportional to the amount with the piezoelectric material is compressed; since the piezoelectric material is very difficult to compress the generated electrical signal will be weak and difficult to detect.

It is an aim of the present invention to mitigate or obviate at least some of the disadvantages associated with existing button assemblies which use piezoelectric material.

BRIEF SUMMARY OF THE INVENTION

According to an aspect of the present invention there is provided a button assembly, comprising, an actuator member; a base member having a cavity defined therein which can receive a least a part of the actuator member; a flexible film which comprises piezoelectric material; a first electrode which is located between the piezoelectric material of the flexible film and the actuator member, and a second electrode which is located between the piezoelectric material of the flexible film and the base member, and wherein the flexible film is arranged to overlay the cavity in the base member, and to be interposed between the base member and the actuator member, such that moving at least a part of the actuator member into the cavity of the base member will cause the film to stretch thereby generating an electrical signal in the first and second electrodes.

In the preferred embodiment the piezoelectric material is dipolar particles. In the preferred embodiment the flexible film comprises dipolar particles which have a dipole moment which is greater than 7 Debye. In the most preferred embodiment the flexible film comprises dipolar particles a which have a dipole moment which is in the range 7.5-9.5 Debye.

A dipolar particle is a particle which has equal and oppositely charged or magnetized poles separated by a distance.

When the film is stretched its thickness is reduced; the reduction in the thickness reduces the distance between dipolar particles in the film, and hence the density of the dipolar particles which is between the first and second electrodes is increased. The increase of the density of dipolar particles between the first and second electrodes increases the total polarization of the film between the first and the second electrodes. This increase of total polarization induces an electric charge which is collected by the first and second electrodes. The electric charge which is collected by the first and second electrodes can be converted into a voltage signal using, for example, discrete electronic components. The voltage can then be fed to a digital interface such as USB, CAN, LIN or KNX.

In an embodiment the flexible film comprises a core which comprises piezoelectric material, and wherein a first flexible electrically conductive coating is provided on a first surface of the core which defines said first electrode, and a second flexible electrically conductive coating is provided on a second, opposite, surface of the core which defines said second electrode. In the preferred embodiment the flexible film comprises a core having dipolar particles embedded therein.

In an embodiment the actuator has a first electrically conductive coating provided its surface which is facing the flexible film, which defines said first electrode, and the base member has a second electrically conductive coating provided its surface which is facing the flexible film, which defines said second electrode.

The flexible film may further comprise a protective layer which is provided on the first flexible electrically conductive coating, and a protective layer which is provided on the second flexible electrically conductive coating.

The core of the flexible film may comprise an elastomeric substrate such as natural and/or synthetic rubber materials. The core of the flexible film may comprise any one or more of the group comprising, Silicone, Nitrile butadiene rubber NBR, hydrogenated nitrile butadiene rubber HNBR, Chloroprene rubber, ethylene propylene diene monomer rubber EPDM, Polyurethane, and/or Polyacrylate. The dipolar particles may be embedded in the core of the flexible film. The dipolar particles may be nano-particles or micro-particles. The dipolar particles may comprise organic or inorganic material, which either has a dipole moment greater than 7 debye when the dipolar particle are mixed into the silicone; or a dipole moment greater than 7 debye can be induced into the dipolar particles or enhanced in a later stage, e.g. after producing the core which comprises silicone The dipolar particles may comprise polymer; for example the dipolar particles may comprise copolymers which comprise acrylonitrile and/or methacrylates. These provide for highly polar dipolar particles. The dipole of the dipolar particles which comprise polymer can be enhanced by, for example, poling of the material with a strong electric field at a temperature higher than the glass transmission temperature of the particles. The poling remains after cooling of the dipolar particles below the glass transmission temperature. The dipolar particles may comprise polymer inorganic materials; for example the dipolar particles which comprise BaTiO3.

The protective layer may comprise flexible materials such as Polyurethane, natural and/or synthetic rubber, Silicone, Polyacrylate.

Preferably the first and second electrodes are electrically isolated from one another.

The first and/or second flexible electrically conductive coating may comprise at least one of: carbon particles such as Carbon Black, Graphene, Fullerenes, Nanotubes; and/or metallic particles such as flakes and/or nanowires of Silver, Gold, Tungsten and/or Nickel; and/or semiconducting particles such as Silicon, Indiumphosphid and Galliumnitride particles; and/or conductive polymers such as Poly-3,4-ethylendioxythiophen (PEDOT, PEDT), Polyethin (or Polyacetylen, PAC), Polyanilin (PAni), Polyparaphenylen (PPP), Polythiophen (PT) and/or Polypyrrol (PPy). The first and/or second flexible electrically conductive coating may comprise may comprise conductive fibres and/or a conductive cloth, which may comprise metal and/or conductive polymer(s).

The actuator member may comprise a nodule, and wherein the base member has a cavity defined therein which can receive a least a portion of the nodule.

According to a further aspect of the present invention there is provided method of manufacturing a button assembly, comprising the steps of, providing an actuator member; providing a base member having a cavity defined therein which can receive a least a part of the actuator member; providing a flexible film which comprises piezoelectric material; providing a first electrode between the piezoelectric material of the flexible film and the actuator member, and a second electrode between the piezoelectric material of the flexible film and the base member, and positioning the flexible film to overlay the cavity in the base member, and to be interposed between the base member and the actuator member, such that moving at least a part of the actuator member into the cavity of the base member will cause the film to stretch thereby generating an electrical signal in the first and second electrodes.

According to a further aspect of the present invention there is provided a button assembly comprising, a first element having a plurality of nodules and a second element having a plurality of nodules, and wherein the first and second elements are arranged to overlay one another and the nodules of the first element extend in a direction towards the second element, and the nodules of the second region element extend in a direction towards the first element, and wherein the first and second elements are arranged such that the nodules of the first region are offset from the nodules of the second region and the nodules of the second region are offset from the nodules of the first region; a flexible film comprising piezoelectric material; a first electrode which is located between the flexible film and the first element, and a second electrode which is located between the flexible film and the second element; wherein the flexible film is arranged to be interposed between the first and second elements such that moving the at least one of the elements towards the other will cause the nodules of one element to be received between the nodules of the other element causing the flexible film to stretch thereby generating an electrical signal in the first and second electrodes.

The flexible film may further comprise a first flexible electrically conductive coating provided on a first surface of the film which defines the first electrode, and a second flexible electrically conductive costing provided on a second, opposite, surface of the film which defines the second electrode.

The first element may have a first electrically conductive coating provided its surface which is facing the second element, which defines the first electrode, and a second element may have a second electrically conductive coating provided its surface which is facing the first element, which defines the second electrode.

The first and second elements may be mechanically connected by a flexible connecting portion.

The button assembly may comprise a single flexible strip comprising a first region having a plurality of nodules, wherein the first region defines said first element, and a second region having a plurality of nodules, wherein the second region defines said second element; and wherein the flexible strip further comprises a flexible connecting portion which connects the first and second regions; and wherein the flexible strip is folded at the flexible connecting portion so that, the first and second regions overlay one another and the nodules of the first region extend in a direction towards the second region, and the nodules of the second region extend in a direction towards the first region, and wherein the nodules of the first region are offset from the nodules of the second region and the nodules of the second region are offset from the nodules of the first region, and wherein the flexible film is sandwiched between the first and second regions of the folded flexible strip.

According to a further aspect of the present invention there is provided method of manufacturing a button assembly comprising the steps of, providing a first element having a plurality of nodules and a second element having a plurality of nodules; arranging the first and second elements to overlay one another such that nodules of the first element extend in a direction towards the second element, and the nodules of the second region element extend in a direction towards the first element, and such that the nodules of the first region are offset from the nodules of the second region and the nodules of the second region are offset from the nodules of the first region; providing a flexible film comprising piezoelectric material; providing a first electrode between the flexible film and the first element, and a second electrode between the flexible film and the second element; arranging the flexible film to be interposed between the first and second elements such that moving the at least one of the elements towards the other will cause the nodules of one element to be received between the nodules of the other element causing the flexible film to stretch thereby generating an electrical signal in the first and second electrodes.

The step of providing a first element having a plurality of nodules and a second element having a plurality of nodules, may comprise, providing a single flexible strip which comprises, a first region having a plurality of nodules, wherein the first region defines said first element, and a second region having a plurality of nodules, wherein the second region defines said second element, and a flexible connecting portion which connects the first and second regions; and the step of arranging the first and second elements to overlay one another may comprise folding the strip at the flexible connecting portion to sandwich the flexible film between the first and second regions.

BRIEF DESCRIPTION OF THE DRAWINGS

The invention will be better understood with the aid of the description of embodiments of the present invention which are given by way of example only, and illustrated by the figures, in which:

FIG. 1b provides a cross sectional view of the button of FIG. 1a taken along line A-A' of FIG. 1a;

FIG. 2b provides a cross sectional view of the button of FIG. 2a taken along line B-B' of FIG. 2a;

DETAILED DESCRIPTION OF POSSIBLE EMBODIMENTS OF THE INVENTION

Figure 1A:
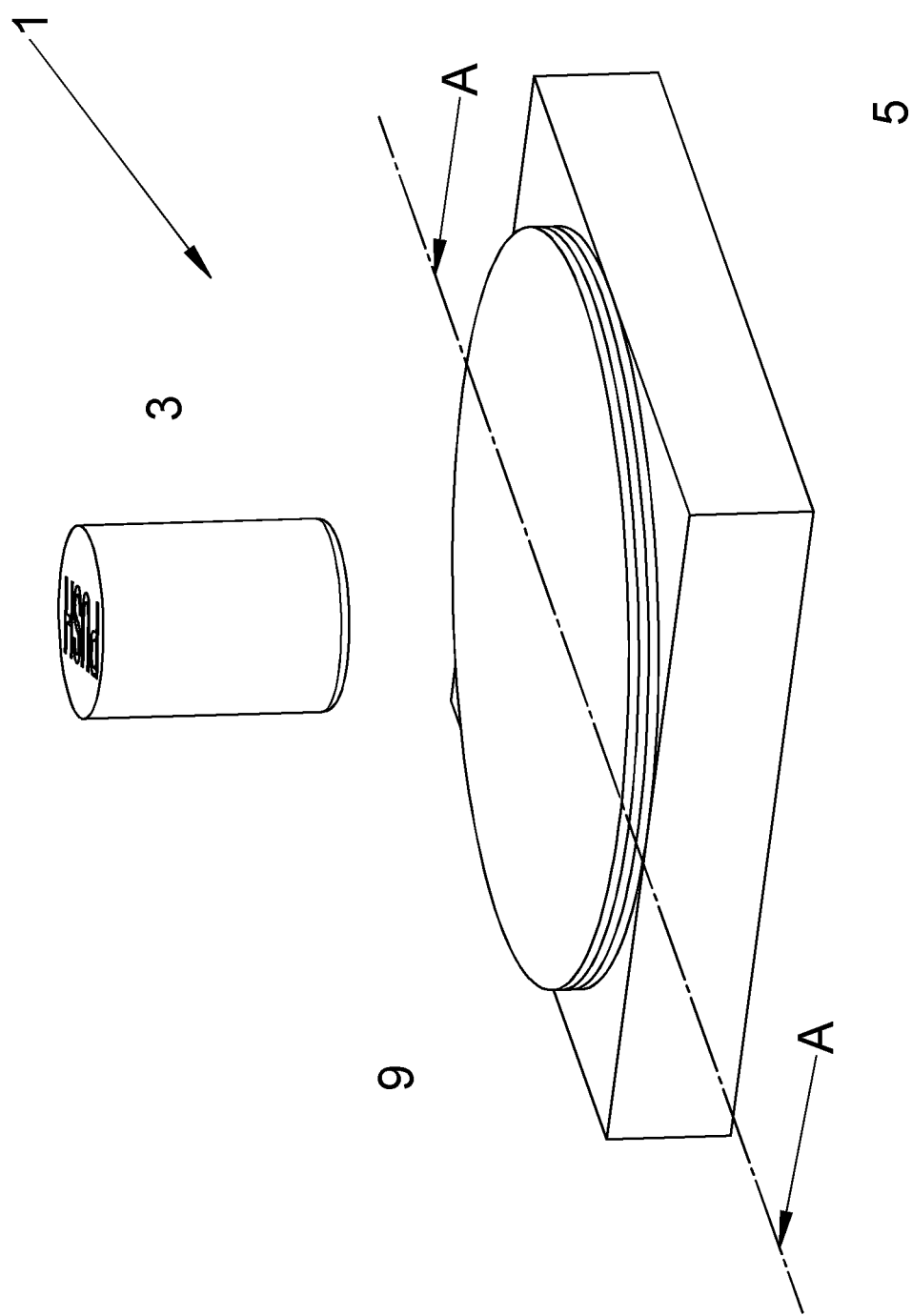
FIG. 1a provides a perspective view of a button assembly according to an embodiment of the present invention, illustrated in a configuration in which no electrical signal is generated.
Figure 1B:
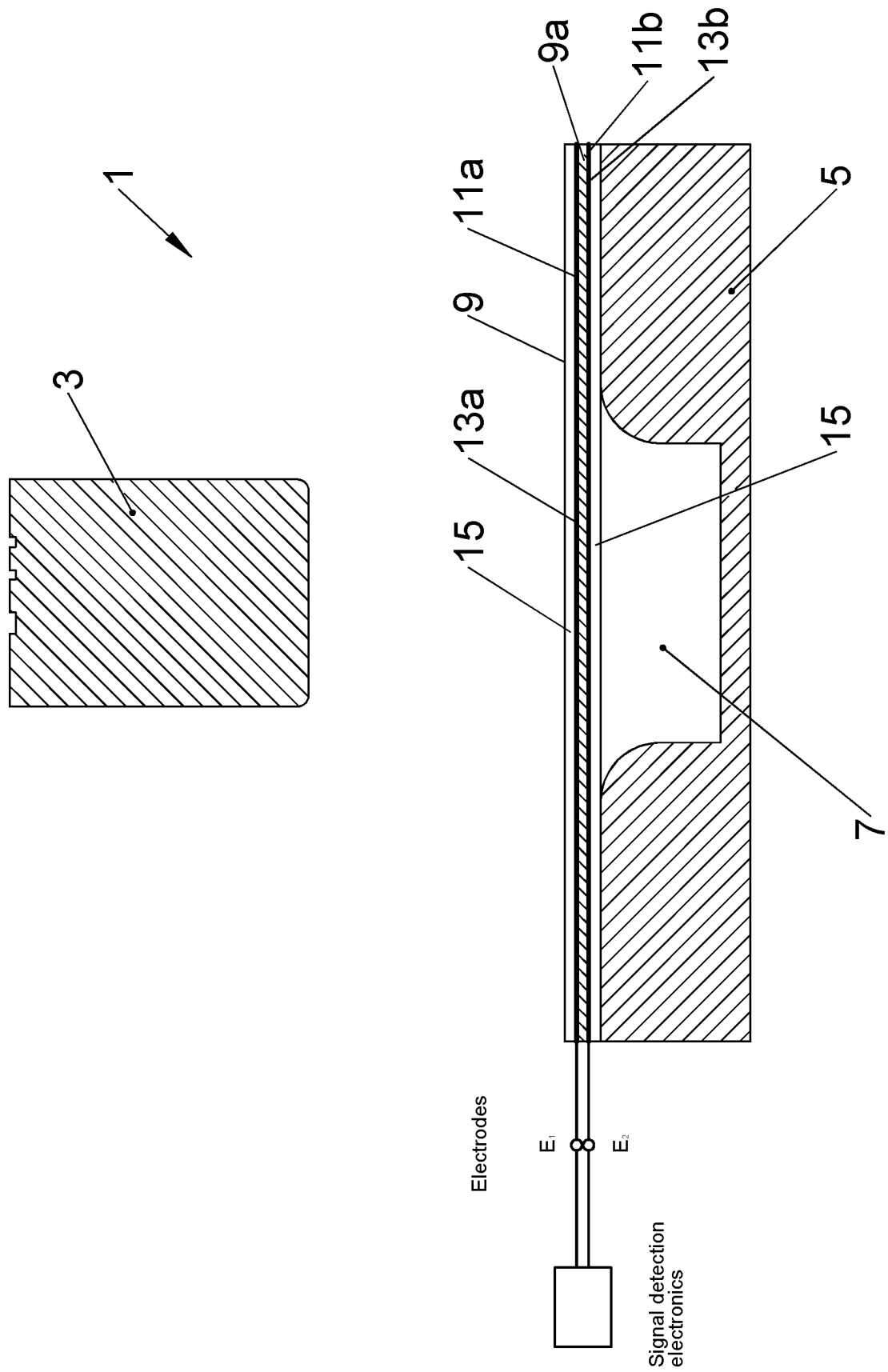

FIG. 1a provides a perspective view of a button assembly 1 according to an embodiment of the present invention; FIG. 1b provides a cross sectional view of the button of FIG. 1a taken along line A-A' of FIG. 1a.

Referring to FIGS. 1a and 1b, the button assembly 1, comprises, an actuator member 3; a base member 5 having a cavity 7 defined therein which can receive a least a part of the actuator member 3; and a flexible film 9 which is arranged to overlay the cavity 7 in the base member 5, and is interposed between the base member 5 and the actuator member 3.

In this example the actuator member 3 comprises a nodule 3, and wherein the base member 5 has a cavity 7 defined therein which can receive a least a part of that nodule 3. However, it will be understood that the actuator member 3 may take any other suitable form. Preferably the base member 5 comprises a polymer, hard elastomer, semiconductor material or metal so that the base member 5 is stiff. Preferably the actuator member 3 comprises a polymer, hard elastomer, semiconductor material or metal so that the actuator member 3 is stiff.

The flexible film 9 comprises a core 9a which comprises piezoelectric material. Most preferably the core 9a will be both flexible and elastic. The core 9a may comprises Silicone, Nitrile butadiene rubber NBR, Hydrogenated nitrile butadiene rubber HNBR, Chloroprene rubber, ethylene propylene diene monomer rubber EPDM, Polyurethane, and/or Polyacrylate. In this example the core 9a is composed of a silicone substrate having dipolar particles embedded therein. The dipolar particles define the piezoelectric material. The silicone substrate ensures that the flexible film 9 is both flexible and elastic.

The dipolar particles may comprise organic and/or inorganic material. In this example the dipolar particles comprise polymer; specifically, the dipolar particles comprise copolymers which comprise acrylonitrile and/or methacrylates. These provide for highly polar dipolar particles. The dipole of the dipolar particles can be enhanced by, for example, poling of the material with a strong electric field at a temperature higher than the glass transmission temperature of the particles. The poling remains after cooling of the dipolar particles below the glass transmission temperature.

In another embodiment the dipolar particles comprise polymer inorganic materials; for example, the dipolar particles which comprise BaTiO3.

The flexible film 9 further comprises a first flexible electrically conductive coating 11a, provided on a first surface 13a of the core 9a, which defines a first electrode 11a, and a second flexible electrically conductive costing 11b, provided on a second, opposite, surface 13b of the core 9a, which defines a second electrode 11b. The first and second electrodes 11a,11b are electrically isolated from one another; in this example this is achieved by ensuring that the first flexible electrically conductive coating 11a and second flexible electrically conductive coating 11b are independent of one another by provided them on opposite surfaces 13a,13b of the core 9a of the flexible film 9. The first flexible electrically conductive coating 11a comprises at least one of: carbon particles such as Carbon Black, Graphene, Fullerenes, Nanotubes; and/or metallic particles such as flakes and/or nanowires of Silver, Gold, Tungsten and/or Nickel; and/or semiconducting particles such as Silicon, Indiumphosphid and Galliumnitride particles; and/or conductive polymers such as Poly-3,4-ethylendioxythiophen (PEDOT, PEDT), Polyethin (or Polyacetylen, PAC), Polyanilin (PAni), Polyparaphenylen (PPP), Polythiophen (PT) and/or Polypyrrol (PPy). The electrically conductive material may comprise conductive fibres and/or a conductive cloth, which may comprise metal and/or conductive polymer(s). The second flexible electrically conductive coating 11b comprises at least one of: carbon particles such as Carbon Black, Graphene, Fullerenes, Nanotubes; and/or metallic particles such as flakes and/or nanowires of Silver, Gold, Tungsten and/or Nickel; and/or semiconducting particles such as Silicon, Indiumphosphid and Galliumnitride particles; and/or conductive polymers such as Poly-3,4-ethylendioxythiophen (PEDOT, PEDT), Polyethin (or Polyacetylen, PAC), Polyanilin (PAni), Polyparaphenylen (PPP), Polythiophen (PT) and/or Polypyrrol (PPy). The electrically conductive material may comprise conductive fibres and/or a conductive cloth, which may comprise metal and/or conductive polymer(s).

The flexible film 9 further comprises a protective layer 15 which is provided on the first flexible electrically conductive coating 11a, and a protective layer 15 which is provided on the second flexible electrically conductive coating 11b. Each protective layer 15 comprises of flexible materials such as Polyurethane, natural and/or synthetic rubber, Silicone, Polyacrylate.

In this embodiment because the flexible film 9 is arranged to overlay the cavity 7 in the base member 5, and is interposed between the base member 5 and the actuator member 3, moving at least a part of the actuator member 3 into the cavity 7 of the base member 5 will cause the flexible film 9 to stretch. The piezoelectric material in the flexible film 9 is defined by the dipolar particles provided in the core 9a; due to the composition of the core 9a containing dipolar particles, this makes the core 9a piezoelectric, and thus makes the flexible film 9 piezoelectric.

The stretching of the flexible film 9 will generating an electrical signal. Specifically when flexible film 9 is stretched the core 9a is stretched which causes a reduction in the thickness of the core 9a; the reduction in the thickness of the core 9a reduces the distance between dipolar particles which are embedded in the core 9a, and hence the density of the dipolar particles which is between the first and second electrodes is increased. The increase of the density of dipolar particles between the first and second electrodes increases the total polarization of the flexible film 9 between the first and the second electrodes. This increase of total polarization induces an electric charge which is collected by the first and second electrodes. The electric charge which is collected by the first and second electrodes can be converted into a voltage signal using, for example, discrete electronic components. The voltage can then be fed to a digital interface such as USB, CAN, LIN or KNX.

Thus the flexible film 9 will generate an electric charge due to the mechanical stress of stretching; this generated electric charge will pass to the first and second flexible electrically conductive coatings 11a,11b thereby generating an electrical charge which can be collected and converted into a voltage signal. Advantageously stretching of the flexible film 9 creates more mechanical stress in the core 9a compared to the mechanical stress created by just compression of the flexible film 35; accordingly compared to prior art solutions a much stronger electrical signal is generated.

Figure 2A:
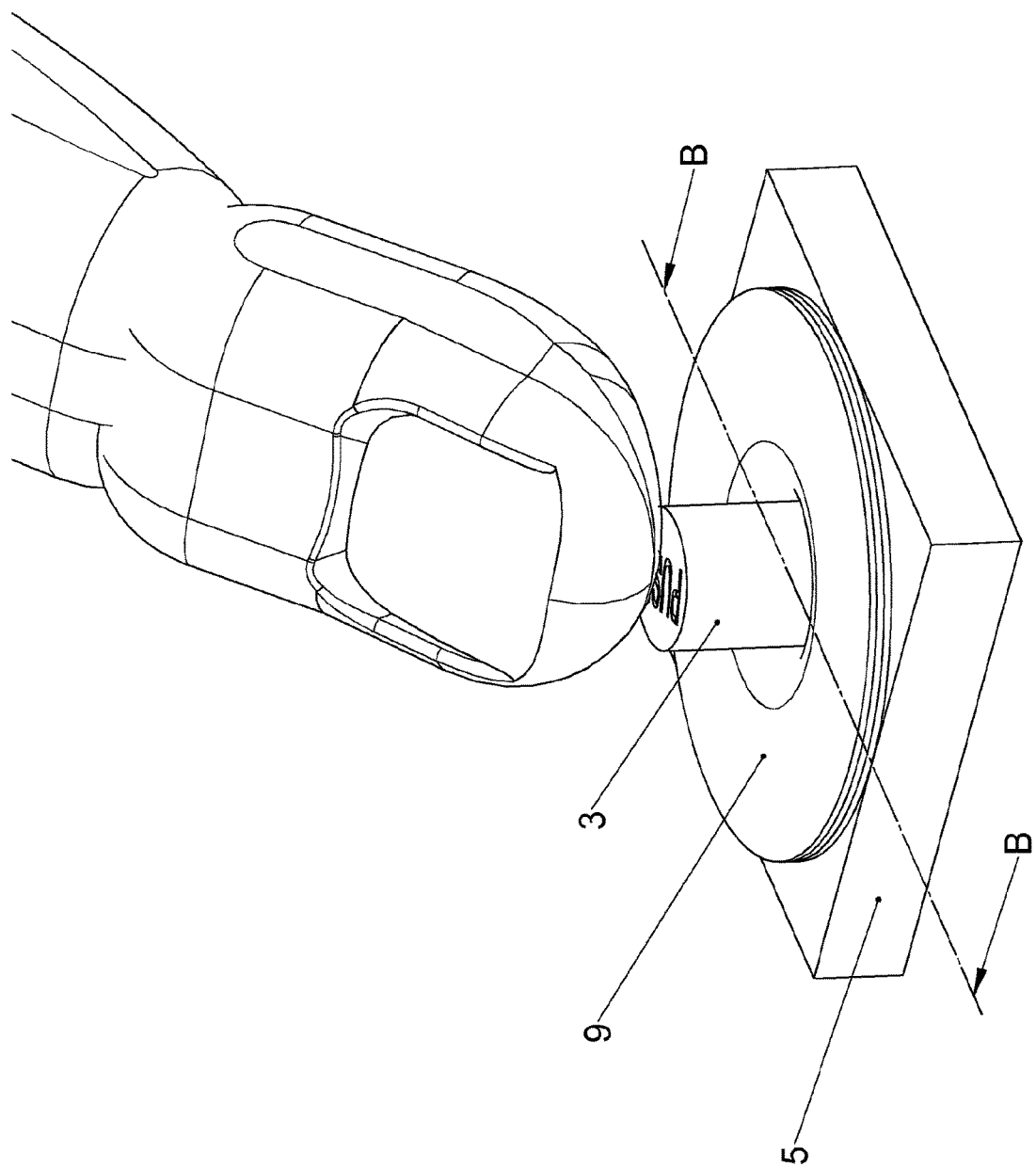
FIG. 2a provides a perspective view of a button assembly according to another embodiment of the present invention, illustrated in a configuration in which an electrical signal is generated.

FIGS. 2a and 2b illustrates the button assembly 1 after actuator member 3 has been moved into the cavity 7 of the base member 5. Referring to FIGS. 2a and 2b, as the actuator member 3 moves into the cavity 7 it will stretch the flexible film 9. The stretching of the flexible film 9 will generate an electrical signal due to the piezoelectric material composition of the core 9a. Advantageously stretching of the flexible film 9 creates more mechanical stress in the core 9a compared to the mechanical stress created by just compression of the flexible film 9; accordingly compared to prior art solutions a much stronger electrical signal is generated.

Additionally, as the actuator member 3 continues to move into the cavity 7 of the base member 5, the flexible film 9 will be compressed between a floor 17 of the cavity 7 and the actuator member 3; this compression of the flexible film 9 will further increase the mechanical stress in the flexible film (in particular will further increase the mechanical stress in the core 9a of the flexible film 9) which causes further increase in the electrical signal which is generated.

Figure 3A:
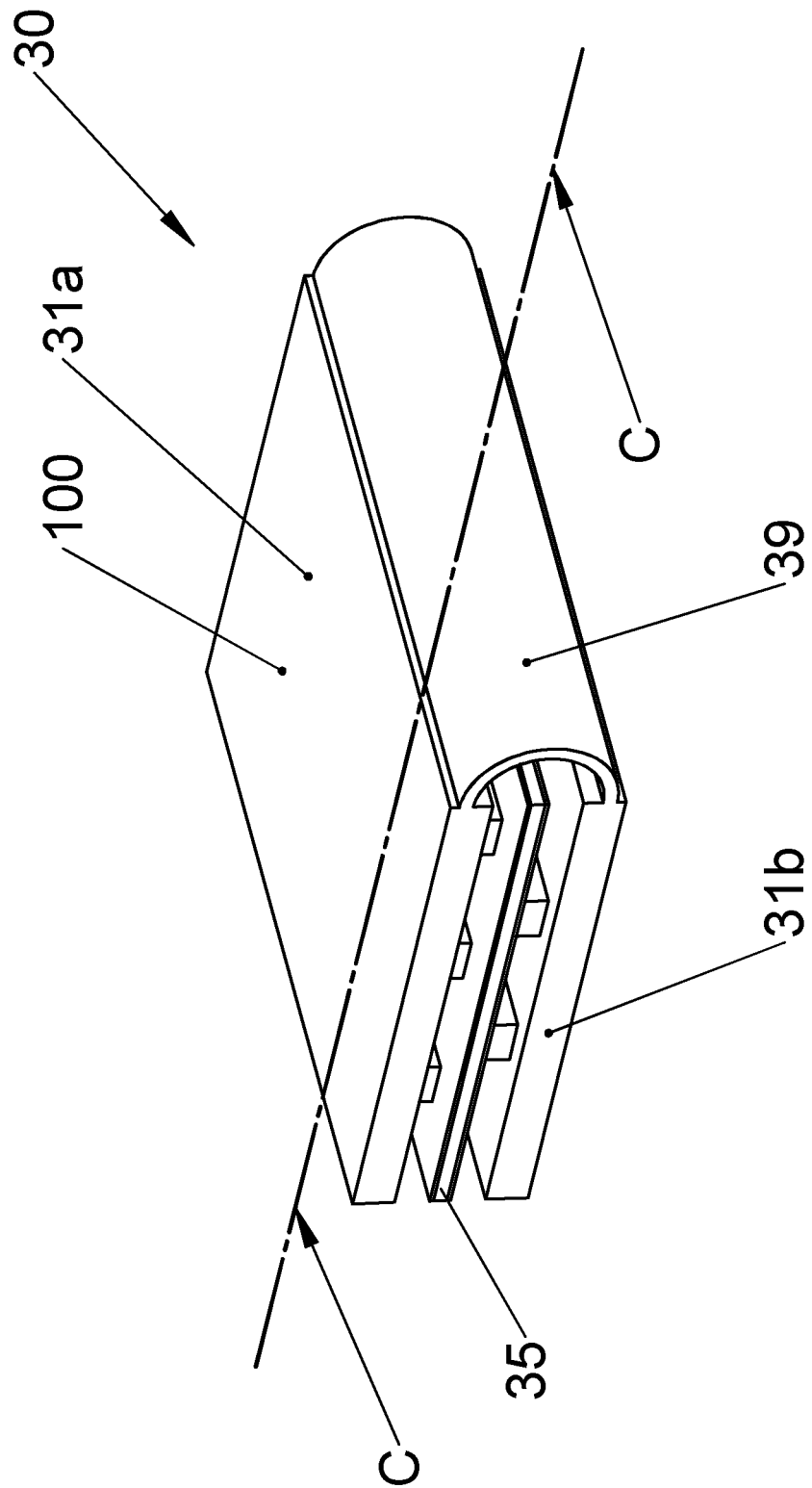
FIG. 3a provides a perspective view of a button assembly according to another embodiment of the present invention.
Figure 3B:
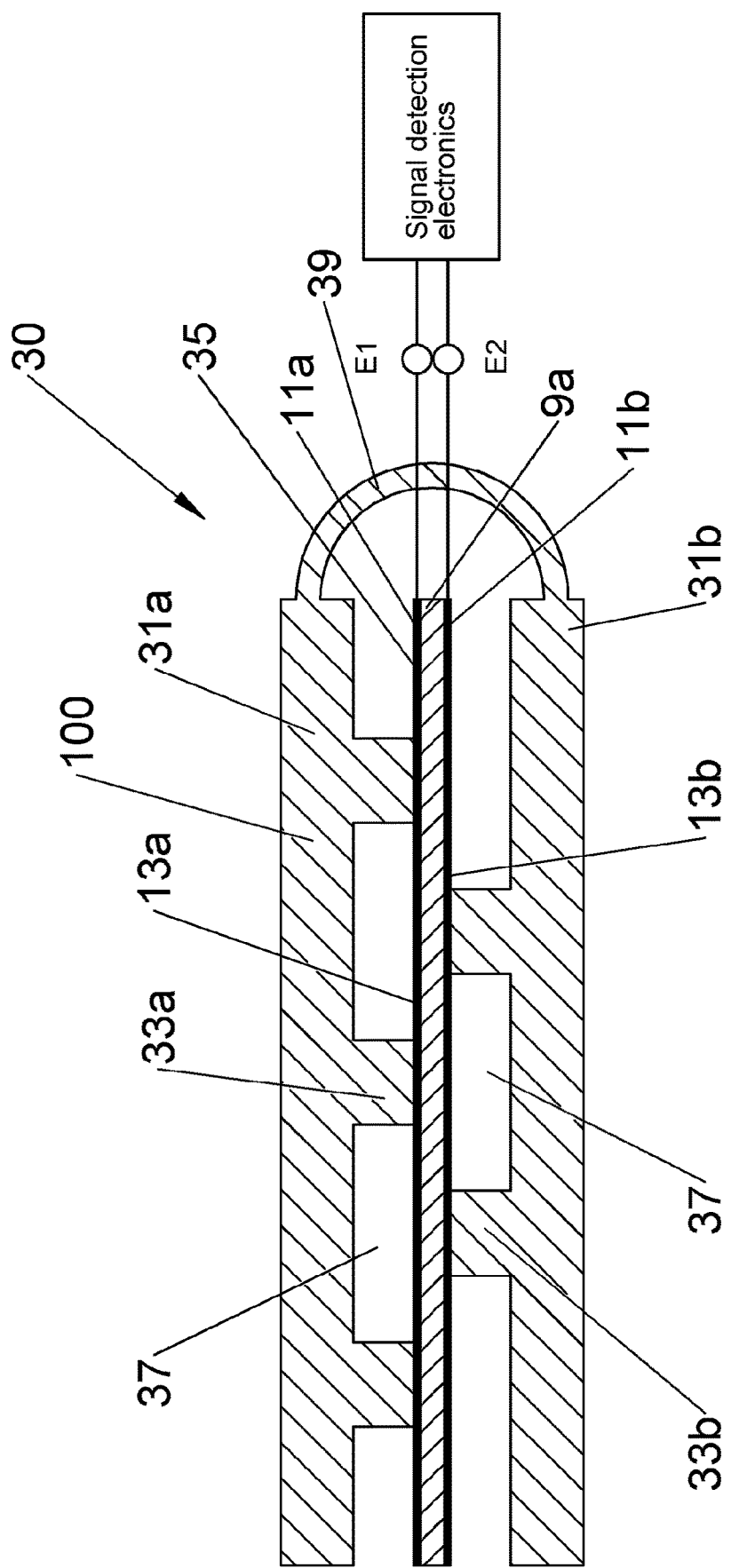
FIG. 3b provides a cross sectional view of a button assembly of FIG. 3a taken along line C-C, illustrated in a configuration in which no electrical signal is generated.
Figure 3C:
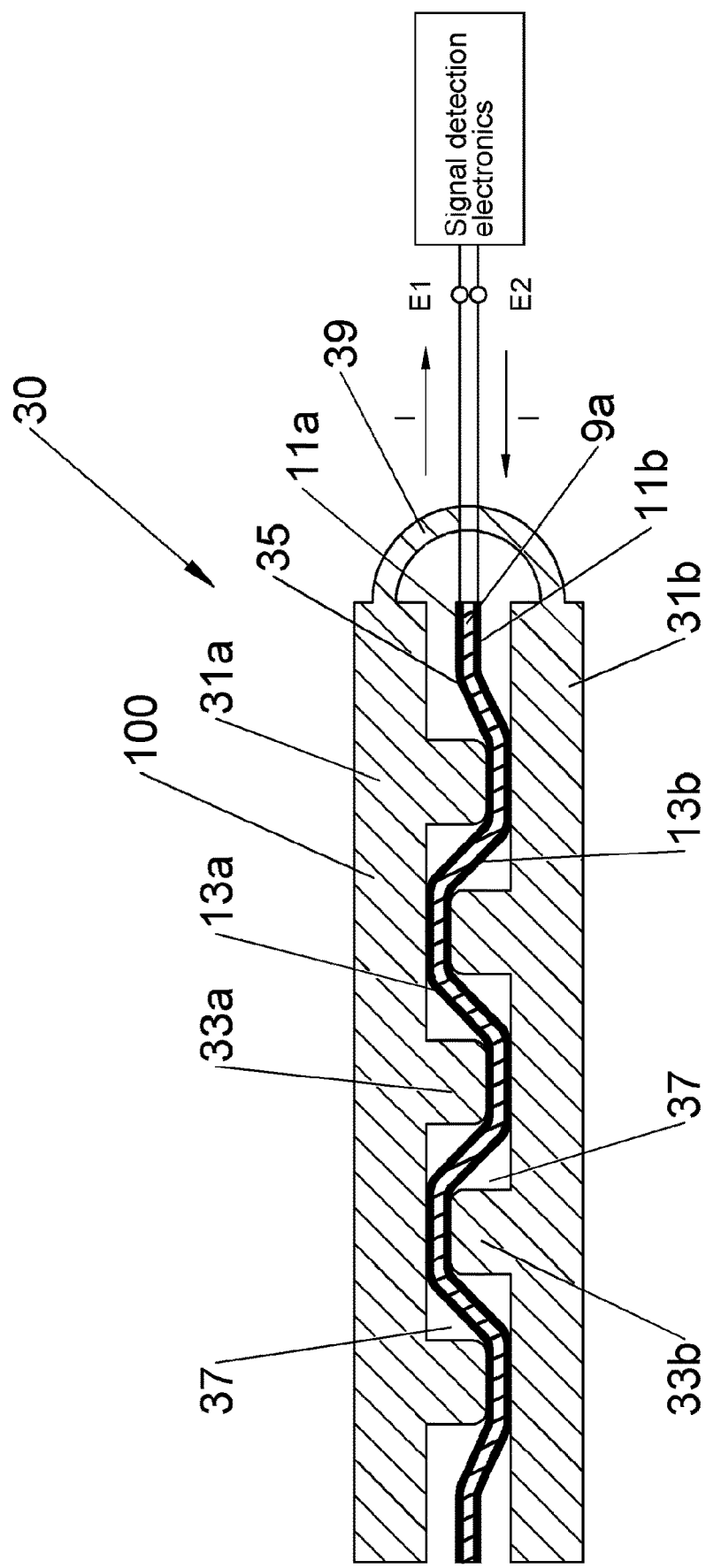
FIG. 3c provides a cross sectional view of the button assembly of FIG. 3a, illustrated in a configuration in which an electrical signal is generated.

FIG. 3a provides a perspective view of a button assembly 30 according to another embodiment of the present invention. FIG. 3b provides a cross sectional view of the button assembly 30, illustrated in a configuration in which no electrical signal is being generated. FIG. 3c provides a cross sectional view of the button assembly 30, illustrated in a configuration in which an electrical signal is generated.

Referring to FIGS. 3a-3c, the button assembly 30 comprises, a first element 31a having a plurality of nodules 33a and a second element 31b having a plurality of nodules 33b. The first and second elements 31a,31b are arranged to overlay one another and the nodules 33a of the first element 31a extend in a direction towards the second element 31b, and the nodules 33b of the second element 31b extend in a direction towards the first element 31a. The first and second elements 31a,b are arranged such that the nodules 33a,33b of the first and second elements 31a,31b are offset from one another such that moving one of the elements 31a,31b towards the other 31a,31b will cause the nodules 33a,33b of one element 31a,31b to be received between the nodules 33a,33b of the other element 31a,31b; in other words moving one of the elements 31a,31b towards the other 31a,31b will cause the nodules 33a,33b of one element 31a,31b to be received into spaces 37 which are between nodules 33a,33b of the other element 31a,31b.

The button assembly 30 further comprises a flexible film 35 comprising piezoelectric material. The flexible film 35 is arranged to be interposed between the first and second elements 31a,31b. Specially the flexible film 35 is arranged to be interposed between the first and second elements 31a,31b so that the nodules 33a,33b of both the first and second elements 31a,31b extend in a direction towards the flexible film 35.

In this example the flexible film 35 comprises a core 9a which comprises piezoelectric material. Most preferably the core 9a will be both flexible and elastic. In this example the core 9a is composed of a silicone substrate having dipole particles (preferably micor or nano dipole particles) embedded therein (the silicone substrate is both flexible and elastic. The dipolar particles may comprise organic and/or inorganic material. In this example the dipolar particles comprise polymer; specifically, the dipolar particles comprise copolymers which comprise acrylonitrile and/or methacrylates. These provide for highly polar dipolar particles. The dipole of the dipolar particles can be enhanced by, for example, poling of the material with a strong electric field at a temperature higher than the glass transmission temperature of the particles. The poling remains after cooling of the dipolar particles below the glass transmission temperature. In another embodiment the dipolar particles comprise polymer inorganic materials; for example, the dipolar particles which comprise BaTiO3.

The flexible film 35 further comprises a first flexible electrically conductive coating 11a, provided on a first surface 13a of the core 9a, which defines a first electrode 11a, and a second flexible electrically conductive costing 11b, provided on a second, opposite, surface 13b of the core 9a, which defines a second electrode 11b. The first and second electrodes 11a,11b are electrically isolated from one another; in this example this is achieved by ensuring that the first flexible electrically conductive coating 11a and second flexible electrically conductive coating 11b are independent of one another by provided them on opposite surfaces 13a,13b of the core 9a of the flexible film 35. The first flexible electrically conductive coating 11a comprises at least one of: carbon particles such as Carbon Black, Graphene, Fullerenes, Nanotubes; and/or metallic particles such as flakes and/or nanowires of Silver, Gold, Tungsten and/or Nickel; and/or semiconducting particles such as Silicon, Indiumphosphid and Galliumnitride particles; and/or conductive polymers such as Poly-3,4-ethylendioxythiophen (PEDOT, PEDT), Polyethin (or Polyacetylen, PAC), Polyanilin (PAni), Polyparaphenylen (PPP), Polythiophen (PT) and/or Polypyrrol (PPy). The electrically conductive material may comprise conductive fibres and/or a conductive cloth, which may comprise metal and/or conductive polymer(s). The second flexible electrically conductive coating 11b comprises at least one of: carbon particles such as Carbon Black, Graphene, Fullerenes, Nanotubes; and/or metallic particles such as flakes and/or nanowires of Silver, Gold, Tungsten and/or Nickel; and/or semiconducting particles such as Silicon, Indiumphosphid and Galliumnitride particles; and/or conductive polymers such as Poly-3,4-ethylendioxythiophen (PEDOT, PEDT), Polyethin (or Polyacetylen, PAC), Polyanilin (PAni), Polyparaphenylen (PPP), Polythiophen (PT) and/or Polypyrrol (PPy). The electrically conductive material may comprise conductive fibres and/or a conductive cloth, which may comprise metal and/or conductive polymer(s).

Optionally, the flexible film 35 may further comprise a protective layer 15 which is provided on the first flexible electrically conductive coating 11a, and a protective layer 15 which is provided on the second flexible electrically conductive coating 11b. Each protective layer 15 may comprise of flexible materials such as Polyurethane, natural and/or synthetic rubber, Silicone, Polyacrylate. It should be noted that the assembly 30 shown in FIGS. 3a-3c, does not comprise any protective layer 15.

In the assembly 30, moving one of the elements 31a,31b towards the other 31a,31b will cause the nodules 33a,33b of one element 31a,31b to be received between the nodules 33a,33b of the other element 31a,31b; in other words moving one of the elements 31a,31b towards the other 31a,31b will cause the nodules 33a,33b of one element 31a,31b to be received into spaces 37 which are between nodules 33a,33b of the other element 31a,31b. Since the flexible film 35 is arranged to be interposed between the first and second elements 31a,31b, the flexible film 35 will be stretched as nodules 33a,33b of one element 31a,31b to be received between the nodules 33a,33b of the other element 31a,31b. The piezoelectric material in the flexible film 35 is defined by the dipolar particles provided in the core 9a; due to the composition of the core 9a containing dipolar particles, this makes the core piezoelectric, and thus makes the flexible film 35 piezoelectric. Accordingly, the stretching of the flexible film 35 will generate an electrical signal.

FIG. 3c illustrates the button assembly 30 after one of the elements 31a,31b towards the other 31a,31b to cause the nodules 33a,33b of one element 31a,31b to be received between the nodules 33a,33b of the other element 31a,31b; in other words one of the elements 31a,31b has been moved towards the other 31a,31b to cause the nodules 33a,33b of one element 31a,31b to be received into spaces 37 which are between nodules 33a,33b of the other element 31a,31b, thereby stretching the flexible film 35 to generate an electrical signal. When the film is stretched its thickness is reduced; the reduction in the thickness reduces the distance between dipolar particles in the film, and hence the density of the dipolar particles which is between the first and second electrodes is increased. The increase of the density of dipolar particles between the first and second electrodes increases the total polarization of the film between the first and the second electrodes. This increase of total polarization induces an electric charge which is collected by the first and second electrodes. The electric charge which is collected by the first and second electrodes can be converted into a voltage signal using, for example, discrete electronic components. The voltage can then be fed to a digital interface such as USB, CAN, LIN or KNX.

Thus the flexible film 35 will generate an electric charge due to the mechanical stress of stretching; this generated electric charge will pass to the first and second flexible electrically conductive coatings 11a,11b thereby generating an electrical charge which can be collected and converted into a voltage signal. Advantageously stretching of the flexible film 35 creates more mechanical stress in the core 9a compared to the mechanical stress created by just compression of the flexible film 35; accordingly compared to prior art solutions a much stronger electrical signal is generated.

Additionally, as the elements 31a,31b are moved closer to one another the flexible film 35 will be compressed between each element 31a,31b and the nodules 33a,33b of the other element 31a,31b. This compression of the flexible film 35 will further increase the mechanical stress in the flexible film (in particular will further increase the mechanical stress in the core 9a of the flexible film 35) which causes a further increase in the density of the dipolar particles which is between the first and second electrodes, which in turn increase in the electrical signal which is generated.

It should be understood that the first and second elements 31a,31b may take any suitable design, shape or configuration. In the assembly 30, the first and second elements 31a,31b are mechanically connected via a flexible connecting portion 39. It should be understood that it is not essential for the first and second elements 31a,31b to be mechanically connected; in another embodiment the first and second elements 31a,31b are mechanically independent. Specially, the assembly 30, comprises a single flexible strip 100 comprising a first region 31a having a plurality of nodules 33a, wherein the first region 31a defines said first element 31a, and a second region 31b having a plurality of nodules 33b, wherein the second region 31b defines said second element 31b; and wherein the flexible strip 100 further comprises a flexible connecting portion 39 which connects the first and second regions 31a,31b. Importantly, the single flexible strip 100 is folded at the flexible connecting portion 39 so that, the first and second regions 31a,31b overlay one another and the nodules 33a of the first region 31a extend in a direction towards the second region 31b, and the nodules 31b of the second region 31b extend in a direction towards the first region 31a, and so that the nodules 33a of the first region 31a are offset from the nodules 33b of the second region 31b. The flexible film 35 is sandwiched between the first and second regions 31a,31b; in particular the flexible film 35 is sandwiched between the nodules 33a,33b of the first and second regions 31a,31b.

Figure 5:
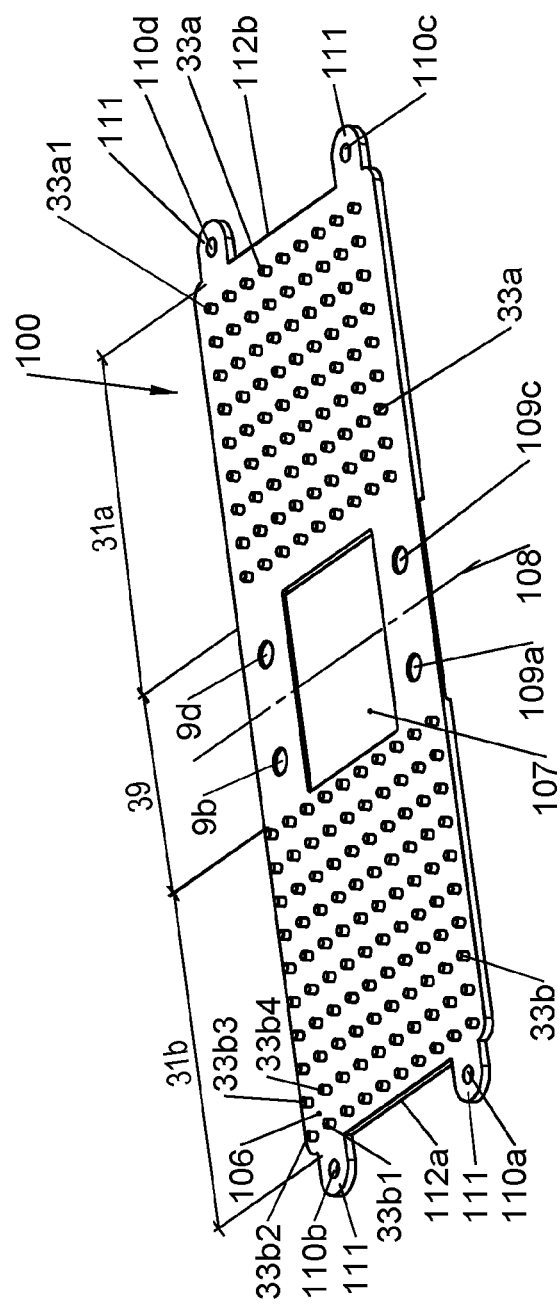
FIG. 5 provides a perspective view of the strip which can be used in the button assemblies of FIGS. 3a-3c and 4a-4c.

FIG. 5 provides a perspective view of the single flexible strip 100 which is provided in the assembly 30 of FIGS. 3a-3c. However as mentioned in should be understood that the a flexible strip is not essential to the present invention; for example the first and second elements 31a,31b may be mechanically independent elements.

Referring to FIG. 5, the strip 100 comprises a first region 31a having a plurality of nodules 33a and a second region 31b having a plurality of nodules 33b. The first and second regions 31a,31b define the first and second elements 31a,31b respectively. It should be understood that the nodules 33a,33b may have any suitable profile; in this example the nodules 33a,33b are cylindrical shaped. Also in this example the nodules 33a,33b are substantially rigid; in this embodiment the nodules 33a,33b are configured to each have a Young's modulus of 20 N/mm$^2$. The nodules 33a,33b may be configured to have a Young's modulus of any value, however preferably the nodules 33a,33b are configured to have a Young's modulus of between 1-100 N/mm$^2$, preferably 0.3-30 N/mm$^2$.

A flexible connecting portion 39 is interposed between the first and second regions 31a,31b. The flexible connecting portion 39 connects the first and second regions 31a,31b. The flexible connecting portion 39 is designed such as to allow the strip 100 to be folded at this section so that the first and second regions 31a,31b can be moved to overlay one another. Preferably an axis 108, which is parallel to the plane of the strip 100, and which extends across the flexible connecting portion 39, defines a fold line 108 along which the strip 100 is to be folded. Typically, but not always, the axis 108 will be positioned to bisect the length of the flexible connecting portion 39.

The first and second regions 31a,31b the nodules 33a,33b and the flexible connecting portion 39 all have the same material composition. However the thickness (in a direction perpendicular to the plane of the strip 100) of flexible connecting portion 39 is less than the thickness (in a direction perpendicular to the plane of the strip 1) of the regions of the first and second regions 31a,31b which are without nodules 33a,33b, thus making it easier to fold the strip 100 at the flexible connecting portion 39. Preferably, the strip 100 is formed of a single moulded piece. In this embodiment the flexible connecting portion 39 further comprises a cut-out 107 which reduces the amount of material present in the flexible connecting portion 39, which further increases the flexibility of the flexible connecting portion 39. However it will be understood that the cut-out 107 is an optional feature.

In another embodiment the material composition of the first and second regions 31a,31b, and nodules 33a,33b is different to the material composition of the flexible connecting portion 39; in such an embodiment the regions of the first and second regions 31a,31b which are without nodules 33a,33b, and the flexible connecting portion 39 may all have equal thicknesses, but the flexible connecting portion 39 may be composed of material which is more flexible than the material of the first and second regions 31a,31b, thus making it easier to fold the strip 100 at the flexible connecting portion 39.

Referring again to the strip 100 shown in FIG. 5, the strip 100 further comprises at least one alignment window provided on one side of the axis 108 and a corresponding alignment window(s) provided on the opposite side of the axis 108. In the example illustrated in FIG. 5 the strip 100 comprises eight alignment windows 109a-d and 110a-d. Alignment windows 109a-d are defined by respective apertures in the flexible connecting portion 39 and alignment windows 110a-d are defined by apertures provided in flaps 111 which extend at opposing end extremities of the strip 100. The alignment windows 109a,b, 110a,b are located on one side of the axis 108 and the corresponding alignment windows 109c,d, 110c,d are located on the opposite side of the axis 108. It should be understood that any number of alignment windows may be provided.

The alignment windows aid correct positioning of the first and second regions 31a,31b with respect to one another when the strip 100 is folded at the flexible connecting portion 39. The alignment windows 109a-d and 110a-d are positioned such that when the strip 100 is folded, and the alignment windows 109a,b, 110a,b located on one side of the axis 108 are aligned with the corresponding alignment windows 109c,d, 110c,d located on the opposite side of the axis 108, then the first and second regions 31a,31b will have a predefined position with respect to one another; specifically the first and second regions 31a,31b will overlay one another and the nodule 33a on the first region 31a will be offset from the nodules 33b of the second region 31b.

In another embodiment only alignment windows 109a-d defined by respective apertures in the first and second regions 31a,31b are provided. In yet another embodiment only the alignment windows 110a-d defined by apertures provided in flaps 111 at opposing end extremities of the silicone strip 100 are provided.

It should be understood that the alignment windows 109a-d, 110a-d are optional features; the provision of alignment windows is not essential for the invention. Thus in a further embodiment no alignment windows are provided. In such an embodiment typically the perimeters 112a, 112b of the respective first and second regions 31a,31b are used to aid correct positioning of the first and second regions 31a,31b with respect to one another when the strip 100 is folded: When folding the strip 100 the perimeters 112a, 112b of the respective first and second regions 31a,31b are aligned; once the perimeters 112a, 112b are aligned then first and second regions 31a,31b will have a predefined, desired, position with respect to one another; specifically the first and second regions 31a,31b will overlay one another and the nodule 33a on the first region 31a will be offset from the nodules 33b of the second region 31b.

Importantly, in the strip 100 illustrated in FIG. 5, the positions of the plurality of nodules 33a in the first region 31a do not correspond to the positions of the plurality of nodules 33b in the second region 31b. On the contrary the positions of the plurality of nodules 33a in the first region 31a are such that when the strip 100 is folded at the flexible connecting portion 39, and the respective alignment windows 109a-d and 110a-d aligned and/or the respective perimeters 112a,112b aligned, the nodules 33a in the first region 31a will be offset from the nodules 33b in the second region 31b. Most preferably the nodules 33a in the first region 31a will have a predefined position with respect to the nodules 33b in the second region 31b. In the preferred embodiment when the strip 100 is folded at the flexible connecting portion 39, and the respective alignment windows 109a-d and 110a-d aligned and/or the respective perimeters 112a,112b are aligned, each respective nodule 33b of the second region 31b will be positioned above a centre point between four adjacent nodules 33a of the first region 33a; for example the nodule 33a1 in the second region 33b will be positioned above the centre point 106 between the four adjacent nodules 33b1-b4 in the first region 31a.

Figure 4A:
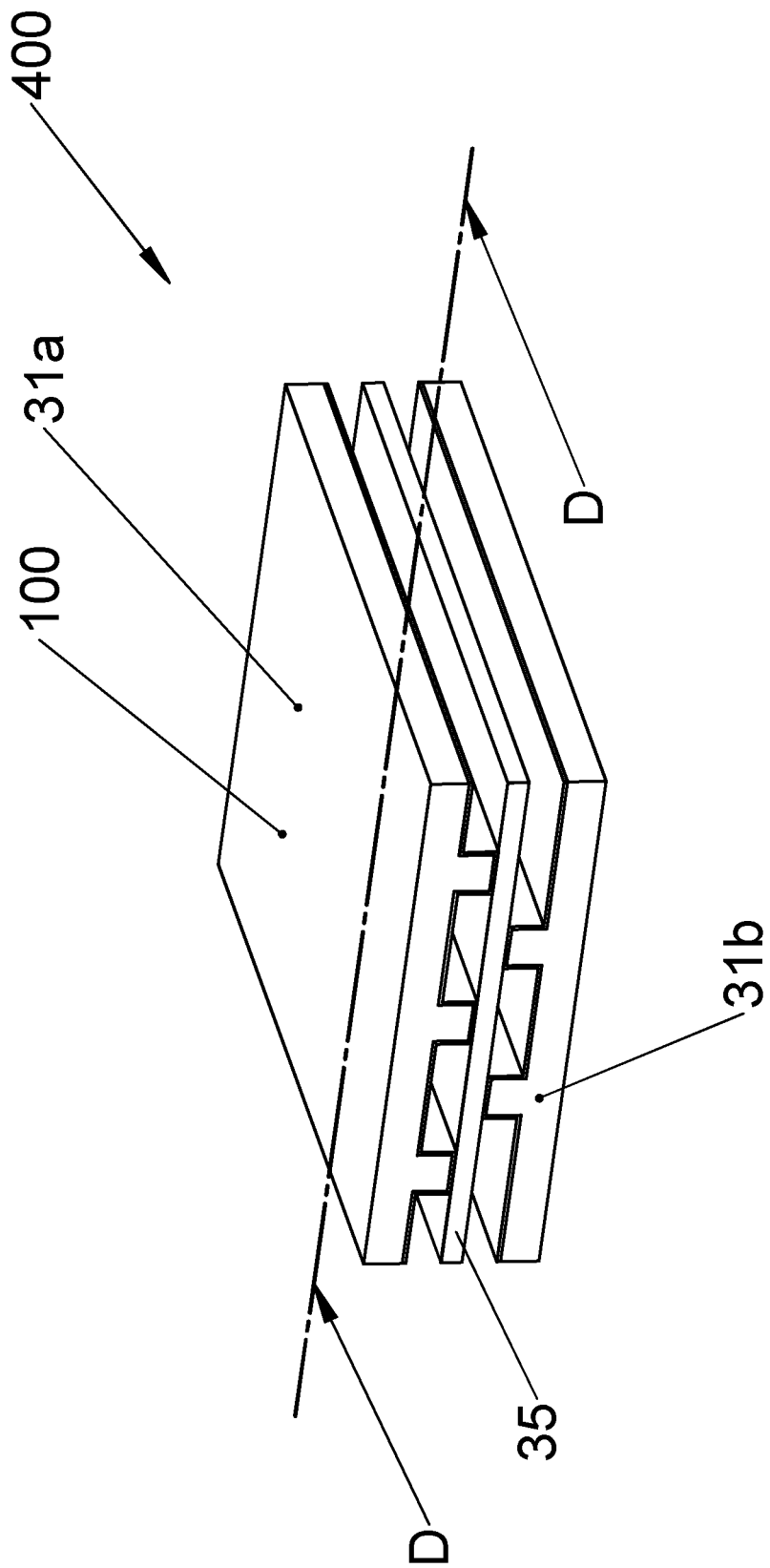
FIG. 4a provides a perspective view of a button assembly according to another embodiment of the present invention.
Figure 4B:
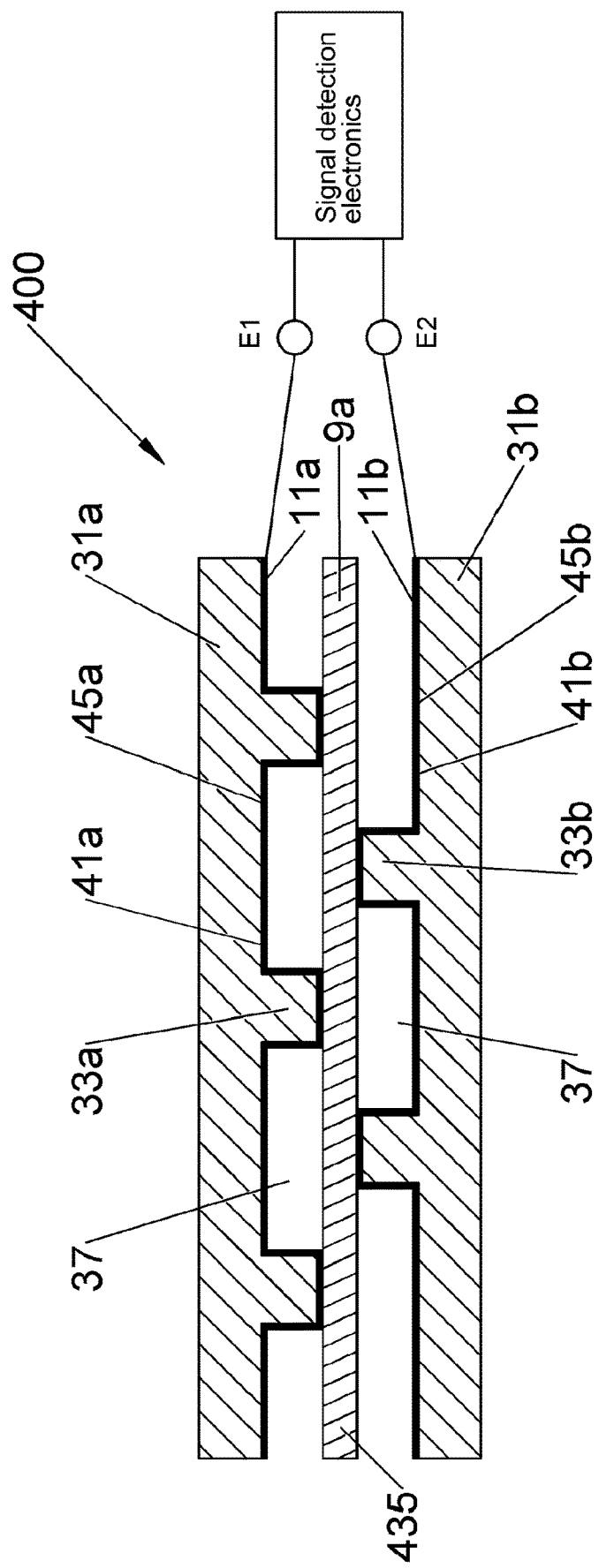
FIG. 4b provides a cross sectional view of a button assembly of FIG. 4a taken along line D-D, illustrated in a configuration in which no electrical signal is generated.
Figure 4C:
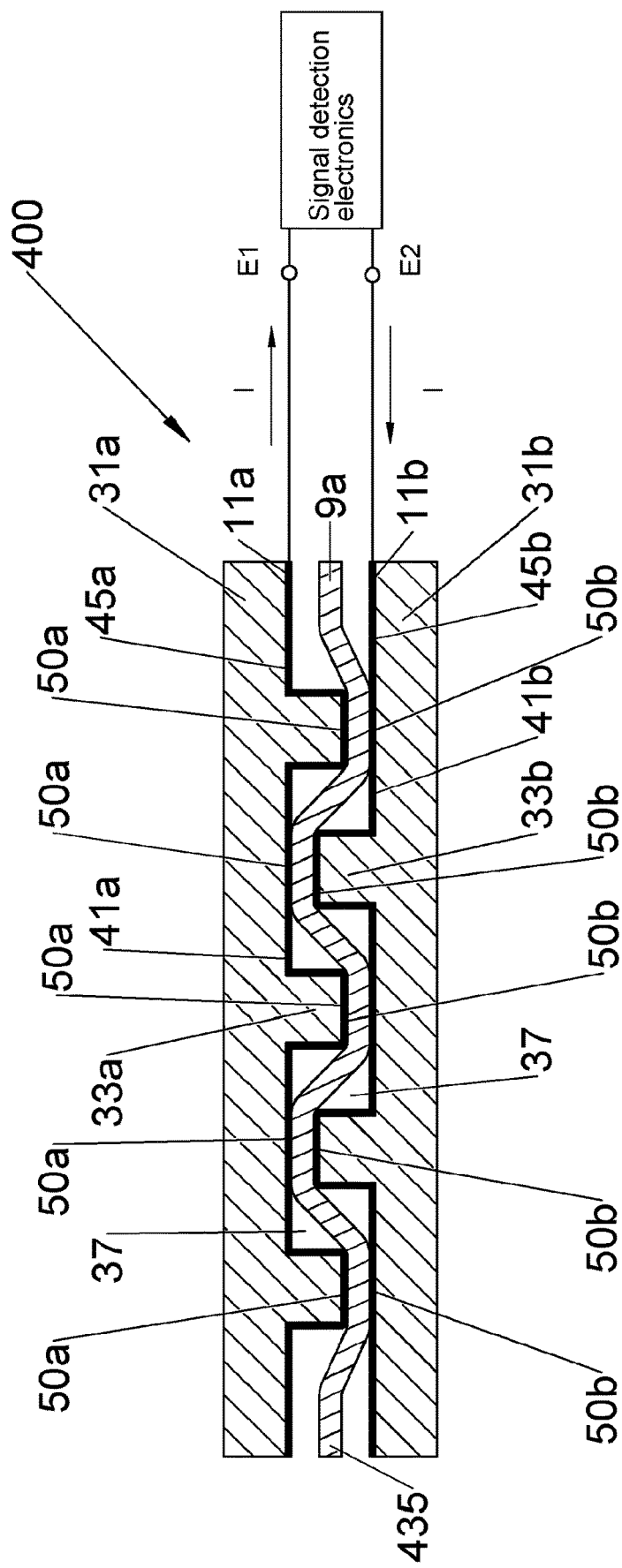
FIG. 4c provides a cross sectional view of the button assembly of FIG. 4a, illustrated in a configuration in which an electrical signal is generated.

In another embodiment the flexible electrically conductive coatings are provided on the first and second elements rather than on the flexible film, as shown in FIGS. 4a-4c. The assembly 400 shown in FIGS. 4a-4c has many of the same features as the assembly 30 shown in FIGS. 3a-3c and like features are awarded the same reference numbers.

However in the assembly 400 shown in FIGS. 4a-4c no flexible strip 100 is provided, on the contrary in the assembly 400 the first and second elements 31a,31b are provided as mechanically independent elements. A further difference is that in the assembly 400 shown in FIGS. 4a-4c the first element 31a has a first electrically conductive coating 45a provided its surface 41a which is facing the second element 31b; and a second element 31b has a second electrically conductive coating 45b provided its surface 41b which is facing the first element 31a. The first electrically conductive coating 45a defines a first electrode 11a and the second electrically conductive coating 45b defines a second electrode 11b. Thus the assembly 400 comprises a film 435 which is without electrically conductive coatings (in other word the film 435 consists a core 9a only). The film 435 comprises piezoelectric material. Most preferably the film 435 will be both flexible and elastic. In this example the film 435 is composed of a silicone substrate having dipolar particles embedded therein. The dipolar particles define the piezoelectric material in the film 435. The dipolar particles may comprise organic and/or inorganic material. In this example the dipolar particles comprise polymer; specifically, the dipolar particles comprise copolymers which comprise acrylonitrile and/or methacrylates. These provide for highly polar dipolar particles. The dipole of the dipolar particles can be enhanced by, for example, poling of the material with a strong electric field at a temperature higher than the glass transmission temperature of the particles. The poling remains after cooling of the dipolar particles below the glass transmission temperature. In another embodiment the dipolar particles comprise polymer inorganic materials; for example, the dipolar particles which comprise BaTiO3.

In the assembly 400, moving one of the elements 31a,31b towards the other 31a,31b will cause the nodules 33a,33b of one element 31a,31b to be received between the nodules 33a,33b of the other element 31a,31b; in other words moving one of the elements 31a,31b towards the other 31a,31b will cause the nodules 33a,33b of one element 31a,31b to be received into spaces 37 which are between nodules 33a,33b of the other element 31a,31b. Since the flexible film 435 is arranged to be interposed between the first and second elements 31a,31b, the flexible film 435 will be stretched as nodules 33a,33b of one element 31a,31b to be received between the nodules 33a,33b of the other element 31a,31b. Due to the composition of the film 435 containing piezoelectric material in the form of dipolar particles the stretching of the flexible film 435 will generate an electrical signal.

FIG. 4b illustrates the button assembly 30 after one of the elements 31a,31b towards the other 31a,31b to cause the nodules 33a,33b of one element 31a,31b to be received between the nodules 33a,33b of the other element 31a,31b; in other words one of the elements 31a,31b has been moved towards the other 31a,31b to cause the nodules 33a,33b of one element 31a,31b to be received into spaces 37 which are between nodules 33a,33b of the other element 31a,31b, thereby stretching the flexible film 435 to generate an electrical signal. Specifically, when the film 435 is stretched its thickness is reduced; the reduction in the thickness reduces the distance between dipolar particles in the film 435, and hence the density of the dipolar particles which is between the first electrically conductive coating 45a and the second electrically conductive coating 45b is increased. The increase of the density of dipolar particles between the first electrically conductive coating 45a and the second electrically conductive coating 45b increases the total polarization of the film 435 between the first electrically conductive coating 45a and the second electrically conductive coating 45b. This increase of total polarization induces an electric charge which is collected by the first electrically conductive coating 45a and the second electrically conductive coating 45b. Specifically the electric charge generated by the film 435 will pass from the film 435 into the first electrically conductive coating 45a at the areas 50a where the first electrically conductive coating 45a contacts the film 435. The electric charge generated by the film 435 will also pass from the film 435 into the second electrically conductive coating 45b at the areas 50b where the second electrically conductive coating 45b contacts the film 435. Thus the electric charge generated by the film 435 will pass to the first and second flexible electrically conductive coatings 11a,11b at the areas 50a,b where the respective first and second electrically conductive coatings 45a,45b contact the film 435. The electric charge which is collected can be converted into a voltage signal using, for example, discrete electronic components. The voltage can then be fed to a digital interface such as USB, CAN, LIN or KNX.

Thus the flexible film 435 will generate an electric charge due to the mechanical stress of stretching; this generated electric charge will pass to the first and second flexible electrically conductive coatings 11a,11b thereby generating an electrical charge which can be collected and converted into a voltage signal. Advantageously stretching of the flexible film 9 creates more mechanical stress in the core 9a compared to the mechanical stress created by just compression of the flexible film 35; accordingly compared to prior art solutions a much stronger electrical signal is generated.

Advantageously stretching of the flexible film 435 creates more mechanical stress compared to the mechanical stress created by just compression of the flexible film 435; accordingly compared to prior art solutions a much stronger electrical signal is generated.

Additionally, as the elements 31a,31b are moved closer to one another the flexible film 435 will be compressed between each element 31a,31b and the nodules 33a,33b of the other element 31a,31b at the areas 50a,b where the respective first and second electrically conductive coatings 45a,45b contact the film 435. This compression of the flexible film 435 will further increase the mechanical stress in the flexible film 435 which causes a further increase in the electrical signal which is generated.

Various modifications and variations to the described embodiments of the invention will be apparent to those skilled in the art without departing from the scope of the invention as defined in the appended claims. Although the invention has been described in connection with specific preferred embodiments, it should be understood that the invention as claimed should not be unduly limited to such specific embodiment.

The invention claimed is:

1. A button assembly comprising,
a first element having a plurality of nodules and a second element having a plurality of nodules, and wherein the first and second elements are arranged to overlay one another and the nodules of the first element extend in a direction towards the second element, and the nodules of the second element extend in a direction towards the first element, and wherein the first and second elements are arranged such that the nodules of the first element are offset from the nodules of the second element and the nodules of the second element are offset from the nodules of the first element;
a flexible film comprising piezoelectric material;
a first electrode which is located between the flexible film and the first element, and a second electrode which is located between the flexible film and the second element;
wherein the flexible film is arranged to be interposed between the first and second elements such that moving the at least one of the elements towards the other will cause the nodules of one element to be received between the nodules of the other element causing the flexible film to stretch thereby generating an electrical signal in the first and second electrodes,
wherein, the button assembly comprises, a single flexible strip comprising a first region having a plurality of nodules, wherein the first region defines said first element, and a second region having a plurality of nodules, wherein the second region defines said second element; and wherein the flexible strip further comprises a flexible connecting portion which connects the first and second regions; and wherein the flexible strip is folded at the flexible connecting portion so that, the first and second regions overlay one another and the nodules of the first region extend in a direction towards the second region, and the nodules of the second region extend in a direction towards the first region, and wherein the nodules of the first region are offset from the nodules of the second region and the nodules of the second region are offset from the nodules of the first region, and wherein the flexible film is sandwiched between the first and second regions of the folded flexible strip.

2. A button assembly according to claim 1 wherein the flexible film further comprises a first flexible electrically conductive coating provided on a first surface of the film which defines the first electrode, and a second flexible electrically conductive costing provided on a second, opposite, surface of the film which defines the second electrode.

3. A button assembly according to claim 2 wherein the flexible film comprises a core which comprises elastomeric material; and wherein the piezoelectric material comprises dipolar particles which are embedded in said core.

4. A button assembly according to claim 2 wherein, the first flexible electrically conductive coating comprises at least one of: carbon particles such as Carbon Black, Graphene, Fullerenes, Nanotubes; and/or metallic particles such as flakes and/or nanowires of Silver, Gold, Tungsten and/or Nickel; and/or semiconducting particles such as Silicon, Indiumphosphid and Galliumnitride particles; and/or conductive polymers such as Poly-3,4-ethylendioxythiophen (PEDOT, PEDT), Polyethin (or Polyacetylen, PAC), Polyanilin (PAni), Polyparaphenylen (PPP), Polythiophen (PT) and/or Polypyrrol (PPy); and the second flexible electrically conductive coating comprises at least one of: carbon particles such as Carbon Black, Graphene, Fullerenes, Nanotubes; and/or metallic particles such as flakes and/or nanowires of Silver, Gold, Tungsten and/or Nickel; and/or semiconducting particles such as Silicon, Indiumphosphid and Galliumnitride particles; and/or conductive polymers such as Poly-3,4-ethylendioxythiophen (PEDOT, PEDT), Polyethin (or Polyacetylen, PAC), Polyanilin (PAni), Polyparaphenylen (PPP), Polythiophen (PT) and/or Polypyrrol (PPy).

5. A button assembly according to claim 1 wherein the first element has a first electrically conductive coating provided its surface which is facing the second element, which defines the first electrode, and a second element has a second electrically conductive coating provided its surface which is facing the first element, which defines the second electrode.

6. A button assembly according to claim 1 wherein the film further comprises a protective layer which is provided on the first flexible electrically conductive coating, and a protective layer which is provided on the second flexible electrically conductive coating.

7. A button assembly according to claim 6 wherein the protective layer comprises, Polyurethane, natural and/or synthetic rubber, Silicone, and/or Polyacrylate.

8. A method of manufacturing a button assembly comprising,
providing a first element having a plurality of nodules and a second element having a plurality of nodules;
arranging the first and second elements to overlay one another such that nodules of the first element extend in a direction towards the second element, and the nodules of the second element extend in a direction towards the first element, and such that the nodules of the first element are offset from the nodules of the second element and the nodules of the second element are offset from the nodules of the first element;
providing a flexible film comprising piezoelectric material;
providing a first electrode between the flexible film and the first element, and a second electrode between the flexible film and the second element;
arranging the flexible film to be interposed between the first and second elements such that moving the at least one of the elements towards the other will cause the nodules of one element to be received between the nodules of the other element causing the flexible film to stretch thereby generating an electrical signal in the first and second electrodes,
wherein said step of arranging the first and second elements to overlay one another comprises folding a single strip which comprises a first region having a plurality of nodules, wherein the first region defines said first element and a second region having a plurality of nodules, wherein the second region defines said second element, and a flexible connecting portion which connects the first and second elements so that the flexible film is sandwiched between the first and second regions of the folded flexible strip.

* * * * *